(12) United States Patent
Choi et al.

(10) Patent No.: US 8,647,899 B2
(45) Date of Patent: Feb. 11, 2014

(54) ORGANIC LIGHT EMITTING DEVICE AND MANUFACTURING METHOD THEREOF

(75) Inventors: Jung-Mi Choi, Seoul (KR); Hoon Kim, Hwaseong-si (KR)

(73) Assignee: Samsung Display Co., Ltd., Yongin (KR)

(*) Notice: Subject to any disclaimer, the term of this patent is extended or adjusted under 35 U.S.C. 154(b) by 512 days.

(21) Appl. No.: 12/352,963

(22) Filed: Jan. 13, 2009

(65) Prior Publication Data

US 2010/0013071 A1    Jan. 21, 2010

(30) Foreign Application Priority Data

Jul. 16, 2008  (KR) .................. 10-2008-0068910

(51) Int. Cl.
*H01L 21/00*    (2006.01)

(52) U.S. Cl.
USPC .............. 438/27; 257/E51.018; 257/E21.499

(58) Field of Classification Search
USPC ................. 257/678–733, E23.001–E23.194, 257/E21.199–E21.519, E21.19, E51.018, 257/E33.056; 438/106–128, 65, 64, 26–28
See application file for complete search history.

(56) References Cited

U.S. PATENT DOCUMENTS

| | | | | |
|---|---|---|---|---|
| 4,357,557 A | * | 11/1982 | Inohara et al. | 313/509 |
| 6,818,479 B2 | * | 11/2004 | Boroson et al. | 438/127 |
| 2002/0005696 A1 | * | 1/2002 | Yamazaki et al. | 315/169.3 |
| 2003/0057574 A1 | * | 3/2003 | Boroson et al. | 257/788 |
| 2004/0119407 A1 | * | 6/2004 | Kim et al. | 313/512 |
| 2004/0232833 A1 | * | 11/2004 | Menda et al. | 313/512 |
| 2004/0242115 A1 | * | 12/2004 | Yanagawa | 445/25 |
| 2005/0067718 A1 | * | 3/2005 | Frischknecht | 257/787 |
| 2005/0264189 A1 | * | 12/2005 | Choi et al. | 313/506 |
| 2006/0159840 A1 | * | 7/2006 | Ikagawa | 427/66 |
| 2006/0165929 A1 | * | 7/2006 | Lenges et al. | 428/35.7 |
| 2006/0283546 A1 | * | 12/2006 | Tremel et al. | 156/291 |
| 2007/0096631 A1 | * | 5/2007 | Sung et al. | 313/498 |
| 2007/0278950 A1 | * | 12/2007 | Hu et al. | 313/512 |
| 2008/0143247 A1 | * | 6/2008 | Kim et al. | 313/504 |
| 2008/0185960 A1 | * | 8/2008 | Koshiyama | 313/512 |
| 2009/0039780 A1 | * | 2/2009 | Kim et al. | 313/512 |

FOREIGN PATENT DOCUMENTS

| | | | | |
|---|---|---|---|---|
| EP | 2009060 A1 | * | 12/2008 | H01L 51/52 |
| WO | WO 2005122644 A1 | * | 12/2005 | H05B 33/04 |

* cited by examiner

*Primary Examiner* — Daniel Luke
*Assistant Examiner* — Latanya N Crawford
(74) *Attorney, Agent, or Firm* — H.C. Park & Associates, PLC

(57) ABSTRACT

The present invention relates to an organic light emitting device and a manufacturing method thereof. A manufacturing method of an organic light emitting device according to an exemplary embodiment of the present invention includes forming a thin film structure on a first substrate, forming a dehumidification buffer layer on a second substrate, combining the first substrate and the second substrate, and heat treating the dehumidification buffer layer to soften the dehumidification buffer layer.

8 Claims, 3 Drawing Sheets

ORGANIC LIGHT EMITTING DEVICE AND MANUFACTURING METHOD THEREOF

CROSS-REFERENCE TO RELATED APPLICATION

This application claims priority from and the benefit of Korean Patent Application No. 10-2008-0068910, filed on Jul. 16, 2008, which is hereby incorporated herein by reference for all purposes as if fully set forth herein.

BACKGROUND OF THE INVENTION

1. Field of the Invention

The present invention relates to an organic light emitting device and a manufacturing method thereof.

2. Discussion of the Background

An organic light emitting device has been widely researched as a self-emissive display device using an organic light emission layer.

When the organic light emission layer reacts with moisture and/or oxides, it may be easy for the characteristics thereof to deteriorate. Accordingly, after forming a thin film structure including the organic light emission layer, the thin film structure may be covered by a metal enclosure, a glass substrate, or a passivation layer to close and seal the circumference thereof to protect the thin film structure.

When the metal enclosure or the glass substrate is used, the manufacturing process for forming the organic light emission layer may be complicated, the manufacturing cost may increase, and the volume of the resulting device may be large.

To form the passivation layer, an inorganic material may be deposited or an organic material may be coated; however the characteristics of the organic light emission layer may be deteriorated due to plasma, heat, and ultraviolet rays generated in the process of forming the passivation layer. Also, when the passivation layer has a single-layered structure, the close and seal characteristics thereof may be poor. Therefore, a multi-layered structure has been proposed; however the manufacturing process thereof may be complicated and time consuming.

To solve these problems, a method in which a sealant is directly formed to the thin film structure, and the thin film structure is covered with the passivation layer and again sealed by the sealant, has been proposed. However, the sealant that has been used may not effectively prevent moisture penetration. Also, the uniformity of the passivation layer may be poor such that moisture penetration through a defective portion may not be properly blocked.

SUMMARY OF THE INVENTION

The present invention provides an organic light emitting device having an enhanced seal that may be made by a simplified sealing method.

Additional features of the invention will be set forth in the description which follows, and in part will be apparent from the description, or may be learned by practice of the invention.

The present invention discloses an organic light emitting device including a first substrate, a thin film structure disposed on the first substrate, a second substrate facing the first substrate, an adhesive between the first substrate and the second substrate to enclose and seal a region including the thin film structure, and a dehumidification buffer layer disposed between the thin film structure and the second substrate, and enclosed by the adhesive.

The buffer layer may include a mixture of an ionomer and aluminum (Al).

The organic light emitting device may further include a passivation layer covering the thin film structure, wherein the buffer layer may cover the passivation layer and is contacted with the second substrate, and a region enclosed by the adhesive and the first and second substrates may have no an empty space. The adhesive may include an epoxy resin.

The buffer layer may be adhered to the inside surface of the second substrate, and there may be an empty space between the buffer layer and the thin film structure.

The organic light emitting device may further include a partition enclosing the thin film structure and the buffer layer, disposed inside the adhesive.

The adhesive may include a hardened frit, and the partition may include an epoxy resin.

The buffer layer may be contacted with the partition.

The present invention also discloses a method of manufacturing an organic light emitting device including forming a thin film structure on a first substrate, forming a dehumidification buffer layer on a second substrate, combining the first substrate and the second substrate, and heat treating the dehumidification buffer layer to soften the dehumidification buffer layer.

The buffer layer may include a mixture of an ionomer and aluminum (Al).

The manufacturing method of the organic light emitting device may further include forming a passivation layer to cover the thin film structure.

The softening of the buffer layer may include disposing the first and second substrates on a hot plate in the temperature of 100° C. to 120° C., and pressing them in a vacuum state.

The softening of the buffer layer may include eliminating the empty region between the buffer layer and the passivation layer.

The adhesive may include an epoxy resin.

The method may further include, before combining the first substrate and the second substrate, coating and plasticizing a frit on the second substrate to form the adhesive, forming a partition between the adhesive and the buffer layer, and forming a temporary adhesive outside the adhesive, wherein the combination of the first substrate and the second substrate is executed with the temporary adhesive.

The manufacturing method of the organic light emitting device may further include, after softening the buffer layer, irradiating a laser to the adhesive to harden the adhesive.

The method may further include, after hardening the adhesive, cutting the first and second substrates to remove the temporary adhesive.

The partition may include an epoxy resin, and the temporary adhesive may include an epoxy resin.

Accordingly, the sealing of organic light emitting device may be enhanced and the method thereof may be simplified.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
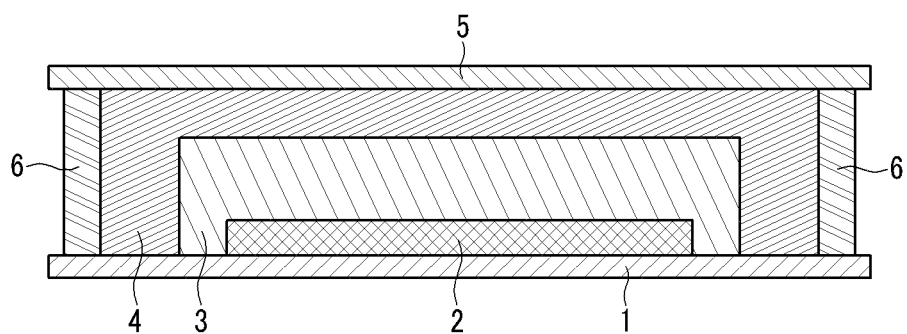
FIG. 1 is a cross-sectional view of an organic light emitting device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Firstly, an organic light emitting device according to an exemplary embodiment of the present invention will be described with reference to FIG. 1 and FIG. 2.

Figure 2:
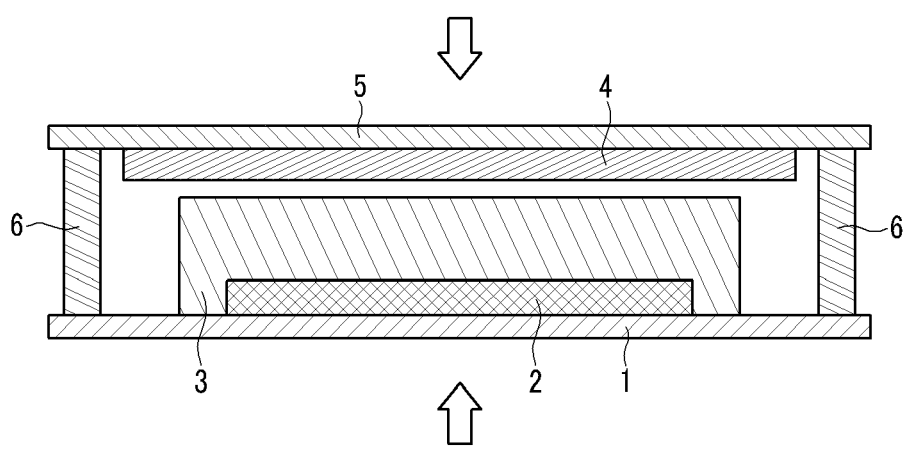
FIG. 2 is a cross-sectional view showing an intermediate step in the manufacturing process of the organic light emitting device shown in FIG. 1.

FIG. 1 is a cross-sectional view of an organic light emitting device according to an exemplary embodiment of the present invention, and FIG. 2 is a cross-sectional view showing an intermediate step in the manufacturing process of the organic light emitting device shown in FIG. 1.

As shown in FIG. 1, an organic light emitting device according to the present exemplary embodiment includes an element substrate 1, a thin film structure 2, a passivation layer 3, a buffer layer 4, a cover substrate 5, and an adhesive 6.

The element substrate 1 and the cover substrate 5 may be made of transparent glass or plastic.

The thin film structure 2 includes an organic light emitting element (not shown), a thin film transistor (not shown), a signal line (not shown), and an insulating layer. The organic light emitting element includes an anode, a cathode, and an organic light emitting member disposed between the two electrodes.

The passivation layer 3 covers the whole thin film structure 2 and may be made of an inorganic material.

The adhesive 6 adheres the element substrate 1 and the cover substrate 5 to each other, and may include an epoxy resin.

The buffer layer 4 may be transparent, may have a hygroscopic property or a dehumidifying property, and may be made of a mixture of an ionomer and aluminum (Al). The buffer layer 4 may be made by covering the passivation layer 3 with a thin sheet through a lamination process.

The buffer layer 4 may completely fill the space enclosed by the cover substrate 5 and the adhesive 6.

When manufacturing this organic light emitting device, as shown in FIG. 2, the buffer layer 4 having a sheet shape may be adhered to the cover substrate 5 through a lamination process and may have a thickness of about 10-20 µm and the adhesive 6 may be applied to the circumference thereof. After combining the two substrates 1 and 5, the organic light emitting device may be disposed on a hot plate of a temperature of about 100° C. to 120° C. and pressed in a vacuum state. Thereby, the buffer layer 4 may be softened so that it may flow into the space between two substrates 1 and 5 and completely cover the passivation layer 3.

The buffer layer 4 manufactured by this method may be transparent and may have the good hygroscopic property such that it may be applied to a top emission organic light emitting device. The buffer layer 4 may have a good sealing property so that it seals defects, such as pinholes, that may be generated in the passivation layer 3.

Next, an organic light emitting device according to another exemplary embodiment of the present invention will be described with reference to FIG. 3, FIG. 4, and FIG. 5.

Figure 3:
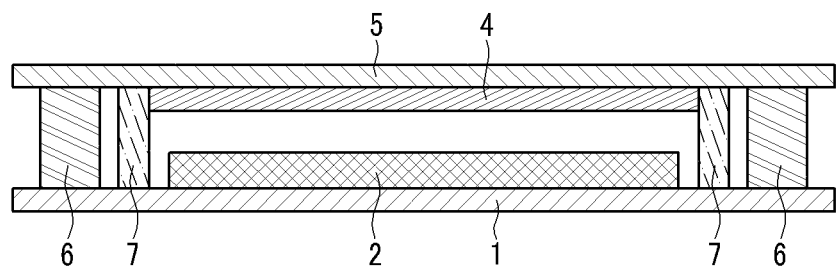
FIG. 3 is a cross-sectional view of an organic light emitting device according to another exemplary embodiment of the present invention.
Figure 4:
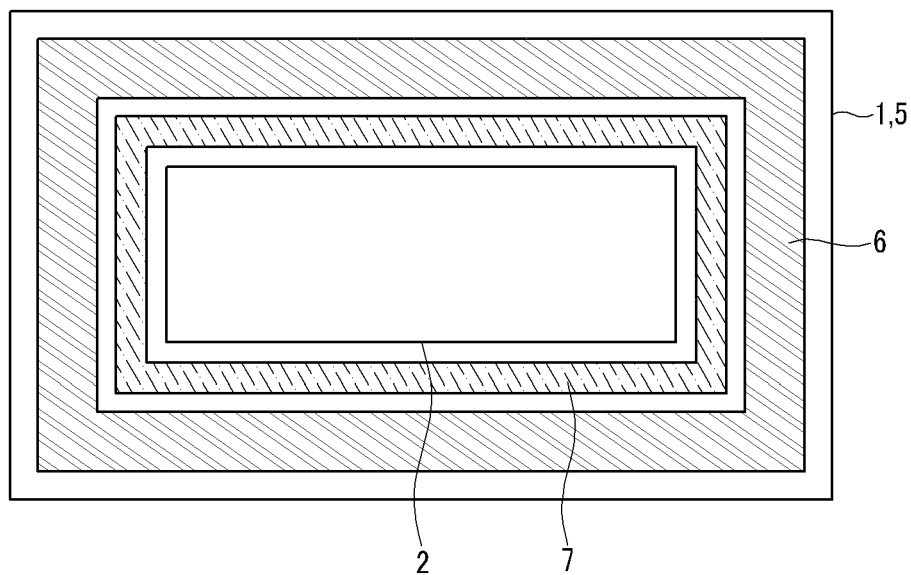
FIG. 4 is a top plan view of the organic light emitting device shown in FIG. 3.
Figure 5:
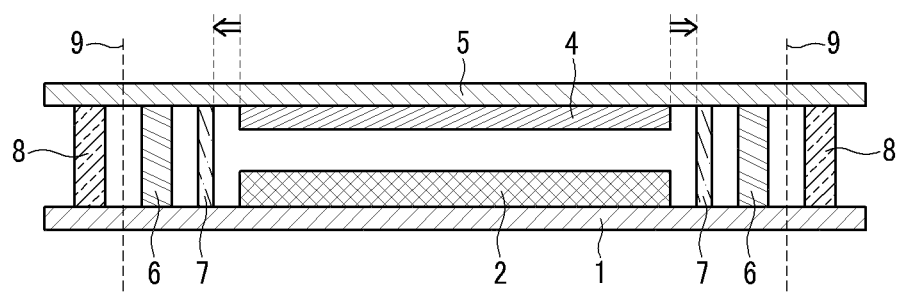
FIG. 5 is a cross-sectional view showing an intermediate step in the manufacturing process of the organic light emitting device shown in FIG. 3 and FIG. 4.

FIG. 3 is a cross-sectional view of an organic light emitting device according to another exemplary embodiment of the present invention, FIG. 4 is a top plan view of the organic light emitting device shown in FIG. 3, and FIG. 5 is a cross-sectional view showing an intermediate step in the manufacturing process of the organic light emitting device shown in FIG. 3 and FIG. 4.

As shown in FIG. 3 and FIG. 4, an organic light emitting device according to the present exemplary embodiment includes an element substrate 1, a thin film structure 2, a buffer layer 4, a cover substrate 5, an adhesive 6, and a partition 7.

Unlike FIG. 1, the present exemplary embodiment does not include a passivation layer 3, and the partition 7 is disposed within a region defined by the adhesive 6. The adhesive 6 may be made of a material such as a frit, and the partition 7 may be made of an epoxy resin. The partition 7 completely encloses a region between the two substrates 1 and 5 in which the thin film structure 2 and the buffer layer 4 are arranged, and may contact the buffer layer 4.

As in the case of FIG. 1 and FIG. 2, the buffer layer 4 may be transparent, may have a hygroscopic property or a dehumidifying property, and may be made of a mixture of an ionomer and aluminum (Al). The buffer layer 4 may be adhered on the cover substrate 5 in the region enclosed by the partition 7, but may not fill the entire region enclosed by the substrates 1 and 5 and the partition 7, thereby maintaining an empty space.

When the organic light emitting device has this structure, as shown in FIG. 5, the adhesive 6 may be coated and plasticized, a buffer layer 4, which may have a sheet shape with a thickness of about 10-20 µm, may be attached to the cover substrate 5 through a lamination process, and the partition 7 and a temporary adhesive 8 may be applied around the buffer layer 4 and the adhesive 6, respectively. Here, the buffer layer 4 and the partition 7 may be spaced apart by a distance, and the temporary adhesive 8 may be made of the same material as the buffer layer 4.

After combining the two substrates 1 and 5 using the temporary adhesive 8, the buffer layer 4 may be softened and closed by post-curing at a temperature of about 100° C. to 120° C. to remove vapor. Here, the softened buffer layer 4 may flow to the partition 7.

Next, a laser beam may be irradiated to harden the adhesive 6 such that the two substrates 1 and 5 may be combined. In this process, moisture may be generated; however the moisture may be removed by the buffer layer 4.

Finally, the two substrates 1 and 5 may be cut according to a cutting line 9 to separate the temporary adhesive 8.

In this process, if the partition 7 is omitted, the buffer layer 4 may be spread during the heat treatment process such that it may contact the adhesive 6. Then, when the laser is irradiated to harden the adhesive 6, the hardening of the adhesive 6 would be incomplete such that the seal may not be sufficient. Accordingly, the partition 7 may prevent contact between the buffer layer 4 and the adhesive 6 to effectively complete the seal.

The partition 7 may have an adhesion property such that the adherence of the adhesive 6 may be enhanced, and may prevent contamination by moisture and oxides along with the adhesive 6.

Exemplary embodiments of the present invention may be applied to an organic light emitting device of a different structure.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing an organic light emitting device, the method comprising:
    forming a thin film structure comprising an organic light emission layer on a first substrate;
    forming a passivation layer covering the thin film structure;
    forming a dehumidification buffer layer on a second substrate;
    forming an adhesive;
    combining the first substrate and the second substrate using the adhesive; and
    heat treating, after combining the first substrate and the second substrate, the dehumidification buffer layer to soften the dehumidification buffer layer such that the dehumidification buffer layer is in a flowing state,
    wherein the passivation layer is disposed between the thin film structure and the dehumidification buffer layer, and the dehumidification buffer layer completely covers an upper surface of the thin film structure, and
    wherein, after the combining of the first substrate and the second substrate but before the heat treating, the dehumidification buffer layer is spaced apart from the passivation layer.

2. The method of claim 1, wherein the dehumidification buffer layer comprises a mixture of an ionomer and aluminum (Al).

3. The method of claim 2, wherein heat treating the dehumidification buffer layer comprises:
    disposing the first substrate and the second substrate on a hot plate at a temperature ranging from 100° C. to 120° C.; and
    pressing the first substrate and the second substrate in a vacuum state.

4. The method of claim 2, wherein heat treating the dehumidification buffer layer eliminates an empty region between the dehumidification buffer layer and the passivation layer.

5. The method of claim 1, wherein the adhesive comprises an epoxy resin.

6. The method of claim 1, wherein, after the heat treating, the dehumidification buffer layer completely fills a space between by the first substrate, the second substrate, and the adhesive.

7. The method of claim 1, wherein after the combining of the first substrate and the second substrate but before the heat treating, the dehumidification buffer layer is spaced apart from the adhesive.

8. The method of claim 1, wherein the adhesive is formed between the first substrate and the second substrate and only outside the circumference of the dehumidification buffer layer.

* * * * *